US008088990B1

(12) United States Patent
Tsai et al.

(10) Patent No.: US 8,088,990 B1
(45) Date of Patent: Jan. 3, 2012

(54) COLOR BUILDING-INTEGRATED PHOTOVOLTAIC (BIPV) PANEL

(75) Inventors: Chin-Yao Tsai, Tainan (TW); Yi-Kai Lin, Tainan (TW); I-Heng Tseng, Tainan (TW); Chih-Hsiung Chang, Tainan (TW); Kun-Chih Lin, Tainan (TW)

(73) Assignee: Auria Solar Co., Ltd., Tainan (TW)

( * ) Notice: Subject to any disclaimer, the term of this patent is extended or adjusted under 35 U.S.C. 154(b) by 0 days.

(21) Appl. No.: 13/118,110

(22) Filed: May 27, 2011

(51) Int. Cl.
*H01L 31/042* (2006.01)
(52) U.S. Cl. .......................................... 136/246
(58) Field of Classification Search .................. 136/244
See application file for complete search history.

(56) References Cited

U.S. PATENT DOCUMENTS

| | | | |
|---|---|---|---|
| 4,663,495 A | 5/1987 | Berman et al. | |
| 5,885,725 A | 3/1999 | Toyama et al. | |
| 5,994,641 A | 11/1999 | Kardauskas | |
| 6,365,823 B1 * | 4/2002 | Kondo | 136/246 |
| 6,441,300 B2 | 8/2002 | Sannomiya et al. | |
| 6,613,603 B1 | 9/2003 | Sano | |
| 7,238,878 B2 | 7/2007 | Gonsiorawski | |
| 7,638,707 B2 | 12/2009 | Shinohara | |
| 7,855,822 B2 | 12/2010 | Huang et al. | |
| 2003/0178058 A1 | 9/2003 | Jongerden et al. | |
| 2009/0101192 A1 | 4/2009 | Kothari et al. | |
| 2009/0133738 A1 | 5/2009 | Shiao et al. | |
| 2009/0151771 A1 | 6/2009 | Kothari et al. | |
| 2009/0159123 A1 | 6/2009 | Kothari et al. | |
| 2009/0242021 A1 * | 10/2009 | Petkie et al. | 136/256 |
| 2009/0242024 A1 | 10/2009 | Kothari et al. | |
| 2009/0293955 A1 | 12/2009 | Kothari et al. | |
| 2010/0096006 A1 | 4/2010 | Griffiths et al. | |
| 2010/0154887 A1 | 6/2010 | Bullen et al. | |
| 2010/0236624 A1 | 9/2010 | Khazeni et al. | |
| 2011/0061708 A1 | 3/2011 | Huang | |

FOREIGN PATENT DOCUMENTS

| | | |
|---|---|---|
| WO | 2009042497 A2 | 4/2009 |
| WO | 2009061632 A2 | 5/2009 |
| WO | 2009079279 A2 | 6/2009 |
| WO | 2009079307 A2 | 6/2009 |
| WO | 2010044901 A1 | 4/2010 |
| WO | 2010044959 A1 | 4/2010 |

* cited by examiner

*Primary Examiner* — Alexa Neckel
*Assistant Examiner* — Miriam Berdichevsky
(74) *Attorney, Agent, or Firm* — Morris Manning & Martin LLP; Tim Tingkang Xia, Esq.

(57) ABSTRACT

In one aspect of the present invention, a photovoltaic panel includes a substrate, a reflective layer formed on the substrate, a first conductive layer formed on the reflective layer, an active layer formed on the first conductive layer, and a second conductive layer formed on the active layer. The reflective layer has an index of refraction and a thickness such that the reflectance spectrum of the photovoltaic device for light incident on the substrate has a maximum in a selected wavelength range in the visible spectrum.

13 Claims, 14 Drawing Sheets

Table 1

| Color | Wavelength | Frequency |
|---|---|---|
| violet | 380-450 nm | 668-789 THz |
| indigo | 420-450 nm | 668-714 THz |
| blue | 450-495 nm | 606-668 THz |
| green | 495-570 nm | 526-606 THz |
| yellow | 570-590 nm | 508-526 THz |
| orange | 590-620 nm | 484-508 THz |
| red | 620-750 nm | 400-484 THz |

FIG. 10

Table 2

| Color | $V_{OC}$ (V) | $I_{SC}$ (A) | $P_{MPP}$ (W) | $P_{Stable}$ (W) | FF | $R_S$ (Ω) | $R_{SH}$ (Ω) | Trans. (400~700) | Trans. (400~800) | Refl. (400~700) | Refl. (400~800) |
|---|---|---|---|---|---|---|---|---|---|---|---|
| Purple | 116.1 | 1.112 | 83.89 | 71.31 | 65.0 | 22.32 | 2600 | 5.1% | 11.6% | 10.5% | 11.4% |
| Dark Blue | 117.9 | 1.012 | 74.77 | 63.55 | 62.7 | 23.87 | 7002 | 4.9% | 10.9% | 14.8% | 14.5% |
| Light Blue | 118.3 | 0.818 | 64.24 | 54.61 | 66.4 | 29.69 | 6060 | 4.1% | 9.5% | 26.6% | 24.7% |

FIG. 11

Table 3

| Color | $V_{OC}$ (V) | $I_{SC}$ (A) | $P_{MPP}$ (W) | $P_{stable}$ (W) | FF | $R_S$ (Ω) | $R_{SH}$ (Ω) | Trans. (400~700) | Trans. (400~800) | Refl. (400~700) | Refl. (400~800) |
|---|---|---|---|---|---|---|---|---|---|---|---|
| Silver (Green) | 118.7 | 0.655 | 49.80 | 42.33 | 64.0 | 46.97 | 4669 | 3.9% | 9.5% | 38.0% | 41.5% |
| Golden | 117.7 | 0.626 | 50.72 | 43.11 | 68.8 | 42.39 | 11947 | 2.5% | 6.3% | 42.8% | 43.0% |

FIG. 12

Table 4

| Initial Value | Purple | Dark Blue | Light Blue | Silver | Golden | Orange | Red | Brown |
|---|---|---|---|---|---|---|---|---|
| $P_{MPP}$ (W) | 83.2 | 81.6 | 64.5 | 49.8 | 50.7 | 88.7 | 98.3 | 120.0 |
| $V_{MPP}$ (V) | 87.0 | 86.0 | 90.8 | 90.7 | 92.5 | 98.2 | 96.1 | 101.9 |
| $I_{MPP}$ (A) | 0.96 | 0.95 | 0.71 | 0.55 | 0.55 | 0.90 | 1.02 | 1.18 |
| $V_{OC}$ (V) | 117.4 | 115.8 | 118.2 | 118.7 | 117.7 | 127.6 | 126.1 | 130.7 |
| $I_{SC}$ (A) | 1.11 | 1.087 | 0.817 | 0.655 | 0.626 | 1.01 | 1.14 | 1.37 |
| Transmittance (400~700) | 5.1% | 4.9% | 4.1% | 3.9% | 2.5% | 9.8% | 7.6% | 1.6% |
| Transmittance (400~800) | 11.6% | 10.9% | 9.5% | 9.5% | 6.3% | 19.9% | 16.2% | 5.9% |
| Reflectance (400~700) | 10.5% | 14.8% | 26.6% | 38.0% | 42.8% | 11.6% | 9.3% | 7.7% |
| Reflectance (400~800) | 11.4% | 14.5% | 24.7% | 41.5% | 43.0% | 12.4% | 10.1% | 8.5% |
| Stable Value | Purple | Dark Blue | Light Blue | Silver | Golden | Orange | Red | Coffee |
| $P_{MPP}$ (W) | 72 | 71 | 56 | 43 | 44 | 83 | 92 | 112 |
| $V_{MPP}$ (V) | 85.0 | 84.1 | 88.8 | 88.6 | 90.4 | 97.2 | 95.1 | 96.7 |
| $I_{MPP}$ (A) | 0.85 | 0.84 | 0.63 | 0.49 | 0.49 | 0.86 | 0.97 | 1.16 |
| $V_{OC}$ (V) | 116.2 | 114.7 | 117.0 | 117.5 | 116.5 | 123.8 | 122.30 | 129.7 |
| $I_{SC}$ (A) | 1.06 | 1.04 | 0.78 | 0.63 | 0.60 | 0.99 | 1.12 | 1.37 |

FIG. 13

COLOR BUILDING-INTEGRATED PHOTOVOLTAIC (BIPV) PANEL

FIELD OF THE INVENTION

The present invention relates generally to a photovoltaic device, and more particularly, to a thin film building-integrated photovoltaic (BIPV) panel that reflects a particular color in the visible spectrum.

BACKGROUND OF THE INVENTION

A photovoltaic cell converts the energy of sunlight into electricity by the photovoltaic effect. Assemblies of photovoltaic cells are used to make photovoltaic modules or solar panels. In building integrated photovoltaic (BIPV) applications, photovoltaic modules are fabricated as an integral part of a building material, such as window, roof cover, and exterior wall materials. BIPV is an ideal solution for utilizing solar energy while maintaining attractive building appearances in crowded urban areas. Most currently available photovoltaic cells are made from bulk materials such as crystalline silicon or polycrystalline silicon. BIPV materials comprising bulk photovoltaic cells are not transparent and are thus restricted to sun shade, roof cover, or exterior wall materials. BIPV window materials need to be transparent and preferably be able to reflect desired colors in the visible spectrum to suit architects' or customers' aesthetic preferences.

Therefore, a heretofore unaddressed need exists in the art to address the aforementioned deficiencies and inadequacies.

SUMMARY OF THE INVENTION

The present invention, in one aspect, relates to a BIPV panel. In one embodiment, the BIPV panel has a substrate, a reflective layer formed on the substrate, the reflective layer having a plurality of first windows exposing a plurality of first portions of the substrate, a first conductive layer formed on the reflective layer and on the plurality of first portions of the substrate exposed by the plurality of first windows, the first conductive layer having a plurality of second windows exposing a plurality of second portions of the substrate, each second window being within a respective first window, an active layer formed on the first conductive layer, the active layer having a plurality of third windows exposing a plurality of first portions of the first conductive layer, each third window being within a respective first window, and a second conductive layer formed on the active layer, the second conductive layer having a plurality of fourth windows exposing a plurality of second portions of the first conductive layer, each fourth window being within a respective first window. The reflective layer has an index of refraction and a thickness such that the reflectance spectrum of the BIPV panel for light incident thereon has a maximum in a selected wavelength range in the visible spectrum.

In one embodiment, the selected wavelength range corresponds to a color of purple, dark blue, light blue, silver, gold, orange, red, brown or a combination thereof.

In one embodiment, the index of refraction of the reflective layer ranges from about 1.5 to about 6.5.

In one embodiment, the reflective layer comprises silicon carbide (SiC), wherein the thickness of the reflective layer ranges from about 1 nm to about 300 nm.

In another embodiment, the reflective layer comprises micro-crystalline silicon (uc-Si), wherein the thickness of the reflective layer ranges from about 1 nm to about 600 nm.

In one embodiment, each of the first conductive layer and the second conductive layer includes a transparent conducting oxide (TCO) or a metal. The TCO comprises zinc oxide (ZnO), tin oxide ($SnO_2$), indium tin oxide (ITO), aluminum tin oxide (ATO), aluminum zinc oxide (AZO), cadmium indium oxide (CIO), cadmium zinc oxide (CZO), gallium zinc oxide (GZO), fluorine tin oxide (FTO), or a combination thereof. The metal includes molybdenum (Mo), titanium (Ti), nickel (Ni), aluminum (Al), gold (Au), silver (Ag), chromium (Cr), copper (Cu) or a combination thereof.

In one embodiment, the active layer comprises one or more photovoltaic layers formed of one or more semiconductors, wherein the one or more semiconductors comprise group IV element semiconductors, group III-V compound semiconductors, group II-VI compound semiconductors, organic compound semiconductors, or a combination thereof.

In another aspect, the present invention relates to a BIPV panel. In one embodiment, the BIPV panel has a substrate, a first conductive layer, an active layer formed on the first conductive layer, a second conductive layer formed on the active layer, and a reflective layer formed between the substrate and the first conductive layer, or formed on the second conductive layer such that the first conductive layer is formed on the substrate, wherein the reflective layer has an index of refraction and a thickness such that the reflectance spectrum of the BIPV panel for light incident thereon has a maximum in a selected wavelength range in the visible spectrum.

In one embodiment, the selected wavelength range corresponds to a color of purple, dark blue, light blue, silver, gold, orange, red, brown or a combination thereof.

In one embodiment, the reflective layer comprises silicon carbide (SiC) or micro-crystalline silicon (uc-Si).

In one embodiment, the thickness of the reflective layer ranges from about 1 nm to about 600 nm.

In one embodiment, each of the first conductive layer and the second conductive layer comprises a transparent conducting oxide (TCO) or a metal.

In yet another aspect, the present invention relates to a BIPV panel. In one embodiment, the BIPV panel has a substrate, a first conductive layer formed on the substrate, an active layer formed on the first conductive layer, and a second conductive layer formed on the active layer, wherein the first conductive layer has a thickness such that the reflectance spectrum of the BIPV panel for light incident thereon has a maximum in a color of orange, red wine, brown, or a combination thereof.

In one embodiment, each of the first conductive layer and the second conductive layer comprises a transparent conducting oxide (TCO) or a metal.

In one embodiment, the thickness of the first conductive layer ranges about 1 nm to about 3000 nm.

In a further aspect, the present invention relates to a method of forming a BIPV panel. In one embodiment, the method includes the steps of depositing a reflective layer on a substrate, scribing the reflective layer to form a plurality of first windows exposing a plurality of first portions of the substrate, depositing a first conductive layer on the reflective layer and on the plurality of first portions of the substrate exposed by the plurality of first windows, scribing the first conductive layer to form a plurality of second windows exposing a plurality of second portions of the substrate, each second window being within a respective first window, depositing an active layer on the first conductive layer, scribing the active layer to form a plurality of third windows exposing a plurality of first portions of the first conductive layer, each third window being within a respective first window, depositing a second conductive layer on the active layer, and scribing the second conductive layer to form a plurality of fourth windows exposing a plurality of second portions of the first conductive layer, each fourth window being within a respective first window. The reflective layer has an index of refraction and a thickness such that the reflectance spectrum of the BIPV panel for light incident on the substrate has a maximum in a selected wavelength range in the visible spectrum.

In one embodiment, the selected wavelength range corresponds to a color of purple, dark blue, light blue, silver, gold, orange, red, or brown. The reflective layer comprises silicon carbide (SiC) or micro-crystalline silicon (uc-Si).

In one embodiment, each of the steps of scribing is performed using a laser.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein:

FIG. 10 is a table that shows wavelength ranges in the visible spectrum and the corresponding colors;

FIG. 11 is a table that summarizes the photovoltaic and optical properties of three BIPV panels according to various embodiments of the present invention;

FIG. 12 is a table that summarizes the photovoltaic and optical properties of two BIPV panels according to various embodiments of the present invention; and FIG. 13 is a table that summarizes the photovoltaic and optical properties of various BIPV panels according to various embodiments of the present invention.

DETAILED DESCRIPTION OF THE INVENTION

Figure 1:
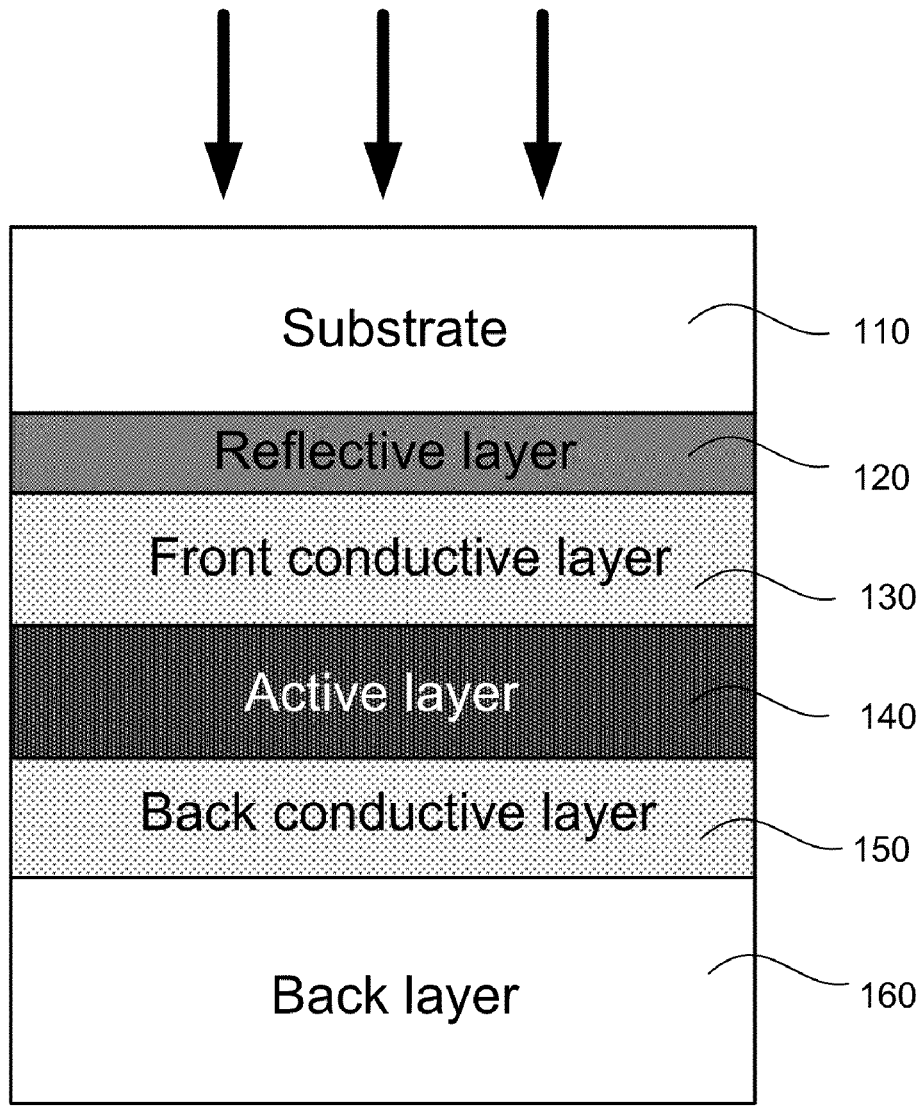
FIG. 1 shows schematically a cross sectional view of a building integrated photovoltaic (BIPV) panel according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top," and "front" or "back" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The term "substrate", as used herein, refers to a thin layer of material such as silicon, silicon dioxide, aluminum oxide, sapphire, germanium, gallium arsenide (GaAs), an alloy of silicon and germanium, indium phosphide (InP), glass, plastic, metal, etc., upon which a semiconductor device, e.g. a photovoltaic cell is applied.

The description will be made as to the embodiments of the present invention in conjunction with the accompanying drawings in FIGS. 1-13. In accordance with the purposes of this invention, as embodied and broadly described herein, this invention, in one aspect, relates to a thin film BIPV panel/device.

FIG. 1 shows schematically a cross sectional view of a photovoltaic panel 100 according to one embodiment of the present invention. The photovoltaic panel 100 can be used as a BIPV panel. The photovoltaic panel 100 has a substrate 110, a reflective layer 120 formed on the substrate 110, a front (first) conductive layer 130 formed on the reflective layer 120, an active layer 140 formed on the front conductive layer 130, a back (second) conductive layer 150 formed on the active layer 140, and a back layer 160 formed on the back conductive layer 150. The reflective layer 120 has an index of refraction and a thickness such that the reflectance spectrum of the photovoltaic panel 100 for light incident thereon has a maximum in a selected wavelength range in the visible spectrum. Table 1 in FIG. 10 shows some wavelength ranges in the visible spectrum and the corresponding colors. The reflective layer 120 has an index of refraction preferably in the range between about 1.5 to about 6.5. Photovoltaic modules comprising photovoltaic cells 100 as shown in FIG. 1 can be fabricated as BIPV panels used as windows, roofs, walls, or likes, of a building. By selecting a proper material and a proper thickness for the reflective layer, such BIPV windows roofs, walls, or likes can have a desired color appearance to suit an architect's or a customer's aesthetic preference.

For the photovoltaic panel 100 shown in FIG. 1, the substrate 110 is a thin layer of material such as silicon, silicon dioxide, aluminum oxide, sapphire, germanium, gallium arsenide (GaAs), an alloy of silicon and germanium, indium phosphide (InP), glass, plastic, metal, etc., upon which a semiconductor device, e.g. a photovoltaic cell is applied.

The front conductive layer 130 and the back conductive layer 150 can be formed of the same material or substantially different materials. In one embodiment, the front conductive layer 130 and the back conductive layer 150 can be formed of transparent conducting oxide (TCO) such as ZnO, $SnO_2$, ITO, ATO, AZO, CIO, CZO, GZO, and FTO, or metal such as Mo, Ti, Ni, Al, Au, Cu, Cr, or Ag. Other TCO and metals can also be utilized to practice the present invention. According to the present invention, sunlight can be incident onto the photovoltaic panel 100 at either the back conductive layer 150 or the substrate 110. If sunlight is incident onto the photovoltaic panel 100 at the back conductive layer 150, the back conductive layer 150 is formed a transparently conductive material. Otherwise, if sunlight is incident onto the photovoltaic panel 100 at the substrate 110, the substrate 110 is formed of a transparent material such as glass, and the front conductive layer 130 is formed of a transparently conductive material. The former is sometimes referred to "substrate-type photovoltaic cells", while the latter is sometimes referred to "superstrate-type photovoltaic cells".

The active layer 140 may includes one or more photovoltaic layers formed of one or more semiconductors. The one or more semiconductors include group IV element semiconductors, group III-V compound semiconductors, group II-VI compound semiconductors, organic compound semiconductors, or a combination thereof. In one embodiment, the active layer 140 includes a stacked structure of tandem junction. The stacked structure has, for example, a layer of amorphous silicon (a-Si) formed on the front conductive layer 130 and a layer of micro-crystalline silicon (µc-Si) formed on the a-Si layer, thereby defining a a-Si/µc-Si tandem junction. In another embodiment, the stacked structure may have a layer of n-doped Cds formed on the front conductive layer 130 and a layer of p-doped CdTe formed on the n-doped Cds layer, thereby defining an n:Cds/p:CdTs tandem junction.

In an alternative embodiment, the photovoltaic layer 140 can be a semiconductor thin film in Group IV elements of the Periodic Table, Group III-V compound semiconductor thin film, Group II-VI compound semiconductor thin film, organic semiconductor thin film or compound thereof. In details, the semiconductor thin film in Group IV elements of the periodic table is at least one of a carbon thin film, a silicon thin film, a germanium thin film, a silicon carbide thin film and a silicon germanium thin film, each of which may be in monocrystalline form, polycrystalline form, amorphous form or microcrystalline form, or a combination thereof. For example, the compound semiconductor thin film in Group III-V of the periodic table is at least one of gallium arsenide (GaAs) thin film and indium gallium phosphide (InGaP) thin film, or a combination thereof. The compound semiconductor thin film in Group II-VI, for example, includes at least one of a copper indium diselenide (CIS) thin film, a copper indium gallium diselenide (CIGS) thin film and a cadmium telluride (CdTe) thin film, or a combination thereof. Furthermore, the above mentioned organic compound semiconductor thin film can be a mixture of a conjugated polymer donor and PCBM acceptor. In addition, the active layer 140 can be a PN single layer of photoelectric conversion structure composed of P-type semiconductor and N-type semiconductor or a PIN single layer of photoelectric conversion structure composed of P-type semiconductor, intrinsic layer and N-type semiconductor.

However, the present invention is not limited thereto. In another embodiment, the active layer 140 can be a stacked structure of a tandem junction, a triple junction or more than three-layers of photoelectric conversion film structure.

In the following, two exemplary embodiments will be described in more detail. In one embodiment, the substrate 110 is formed of glass and has a thickness of about 3.2 mm; the front conductive layer 130 and the back conductive layer 150 are TCO films with thicknesses of about 1700 nm and 1450 nm, respectively. The active layer 140 comprises a layer of a-Si and a layer of µc-Si with a combined thickness of about 1800 nm. The reflective layer 120 is a thin film formed of SiC that has an index of refraction of about 2.55. By varying the thickness of the SiC film, the photovoltaic device 100 can be made to reflect different colors in the visible spectrum. According to the present invention, the thicknesses of the substrate 110, the front conductive layer 130, the back conductive layer 150, and the active layer 140 can also be varied in combination with the thickness of the reflective layer 120 to achieve desired reflective properties.

Figure 2:
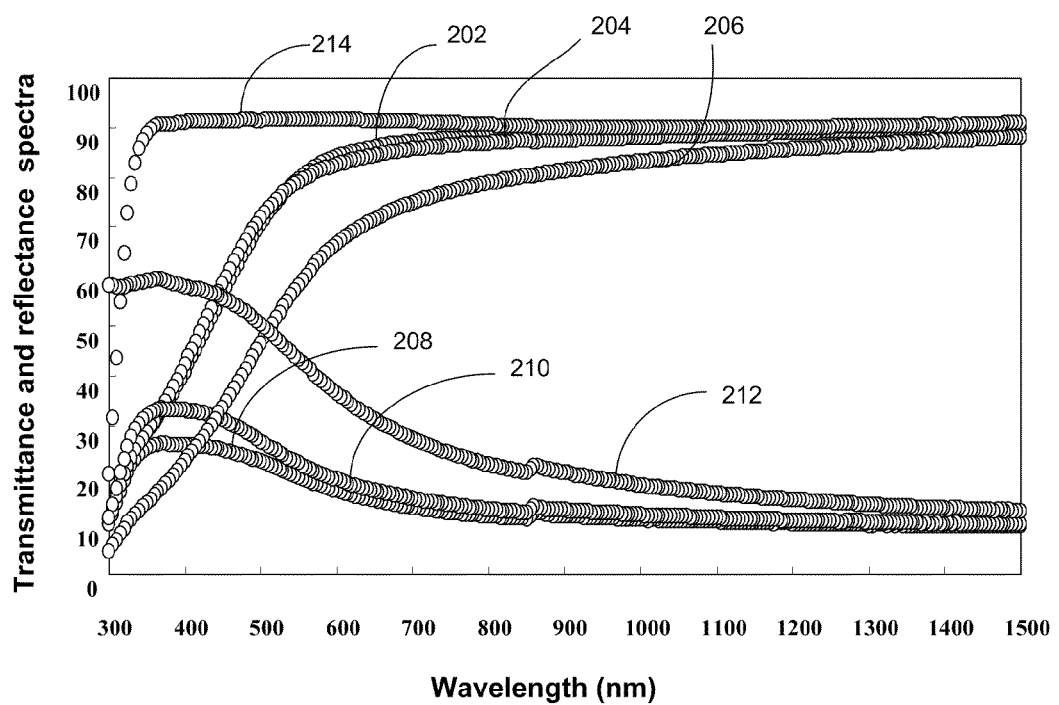
FIG. 2 shows the transmittance and reflectance spectra of various BIPV panels according to various embodiments of the present invention.

FIG. 2 shows the transmittance and reflectance spectra of three photovoltaic panels/devices for light incident on the substrate 110 according to various embodiments of the present invention. Each of the three photovoltaic devices uses a SiC film as the reflective layer 120. The transmittance spectra 202, 204, and 206 correspond to the SiC layer thicknesses of about 10 nm, 15 nm, and 20 nm, respectively. The reflectance spectra 208, 210, and 212 correspond to the SiC layer thicknesses of about 10 nm, 15 nm, and 20 nm, respectively. The curve 214 is the transmittance spectrum of a glass substrate alone. It can be seen that, as the thickness of the SiC film increases, the transmittance decreases and reflectance increases. Also, the reflectance maximum moves toward longer wavelength as the thickness of the SiC film increases. The three photovoltaic panels/devices have a color appearance of purple, dark blue, and light blue, respectively.

Thin film photovoltaic panels comprised of tandem layers of a-Si and μc-Si as the active layer have much higher conversion efficiencies than those with a single a-Si junction. The band gaps of a-Si and μc-Si are about 1.8 and 1.1 eV, respectively. Due to the smaller band gap of μc-Si, photovoltaic cells with the tandem configuration have enhanced absorption in the red light range. While the enhanced absorption leads to higher conversion efficiency, it also results in a dark and dull appearance of the photovoltaic cells without a reflective layer. When a reflective layer 120 is inserted between the substrate 110 and the front conductive layer 130 as shown in FIG. 1, the photovoltaic panel 100 has a more attractive appearance while maintaining the high conversion efficiency. Table 2 in FIG. 11 summarizes the photovoltaic and optical properties of the three photovoltaic devices according to various embodiments of the present invention. In Table 2, $V_{OC}$ is open-circuit voltage; $I_{SC}$ is short-circuit current; $P_{MPP}$ is position of the maximum power point; $P_{Stable}$ is a stabilized power; FF is fill factor; $R_S$ is series resistance; $R_{SH}$ is shunt resistance; "Trans." is transmittance; and "Refl." is reflectance.

Figure 3A:
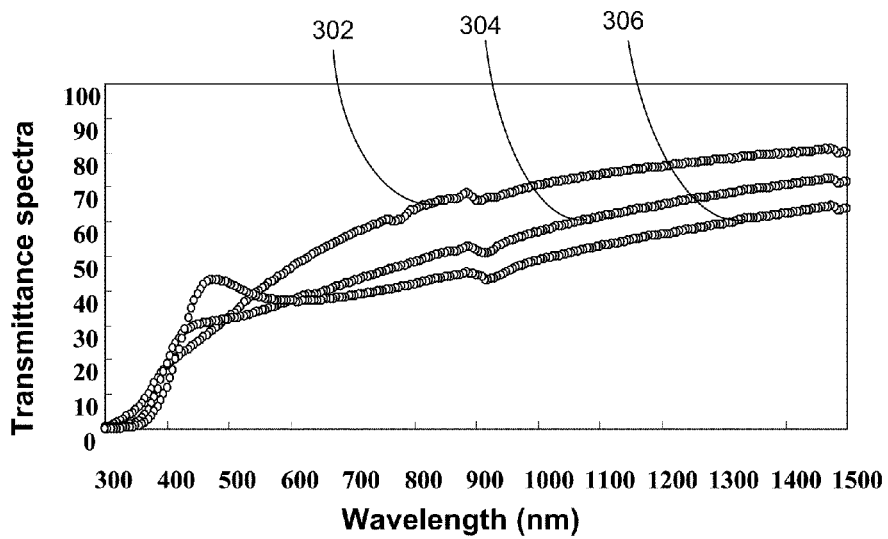
FIGS. 3(a) and 3(b) respectively show the transmittance and reflectance spectra of various BIPV panels according to various embodiments of the present invention.
Figure 3B:
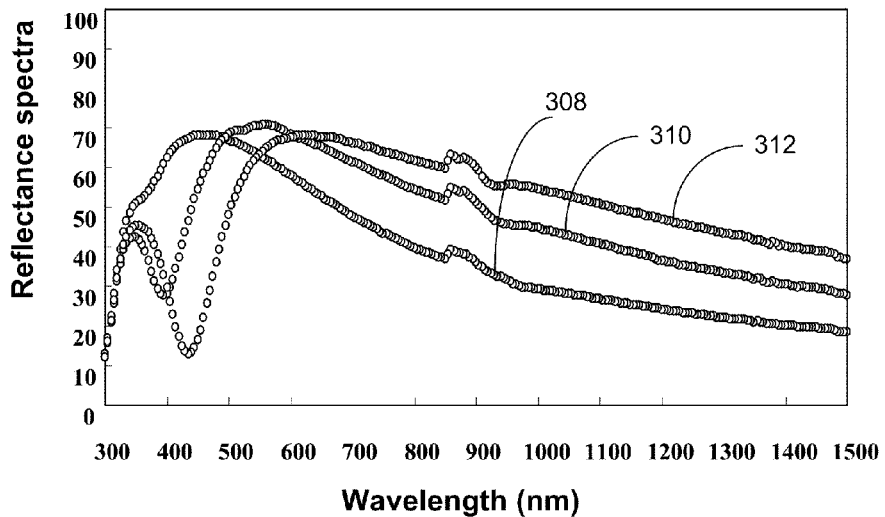

In another embodiment, the reflective layer 120 is a μc-Si film, which has an index of refraction of about 3.5. FIGS. 3(a) and 3(b) respectively show the transmittance and the reflectance spectra of three photovoltaic devices for light incident on the substrate 110 according to various embodiments of the present invention. In FIG. 3(a), the transmittance spectra 302, 304, and 306 correspond to the μc-Si reflective layer thicknesses of about 30 nm, 40 nm, and 50 nm, respectively. In FIG. 3(b), the reflectance spectra 308, 310, and 312 correspond to the μc-Si reflective layer thicknesses of about 30 nm, 40 nm, and 50 nm, respectively. As can be seen in FIG. 3(b), the reflectance maximum moves toward longer wavelength as the thickness of the μc-Si reflective layer increases. Photovoltaic devices with a 30 nm and a 50 nm thick μc-Si reflective layer have color appearances of silver (green) and gold, respectively. Table 3 in FIG. 12 summarizes the photovoltaic and optical properties of two such photovoltaic devices according to various embodiments of the present invention. The parameter notations are the same as those in Table 2.

Table 4 in FIG. 13 summarizes the photovoltaic and optical properties of some more photovoltaic devices according to various embodiments of the present invention. The parameter notations are the same as those in Table 2.

Figure 4A:
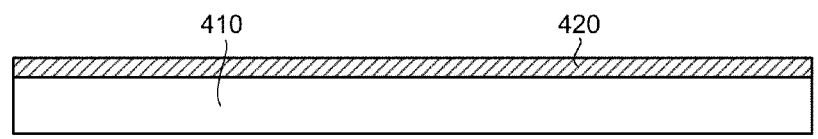
FIGS. 4(a)-4(f) illustrate processing steps of fabricating a BIPV panel according to one embodiment of the present invention.
Figure 4B:
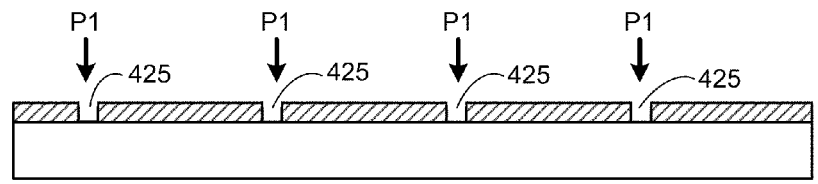
Figure 4C:
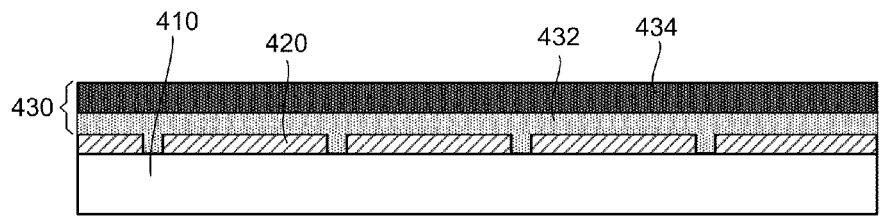
Figure 4D:
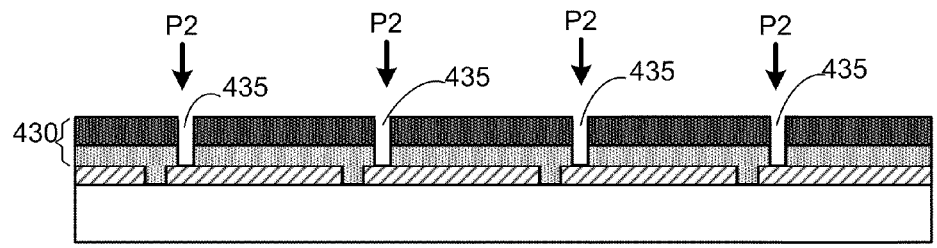
Figure 4E:
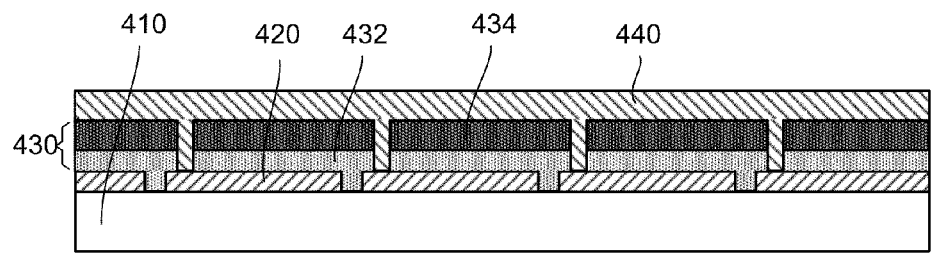
Figure 4F:
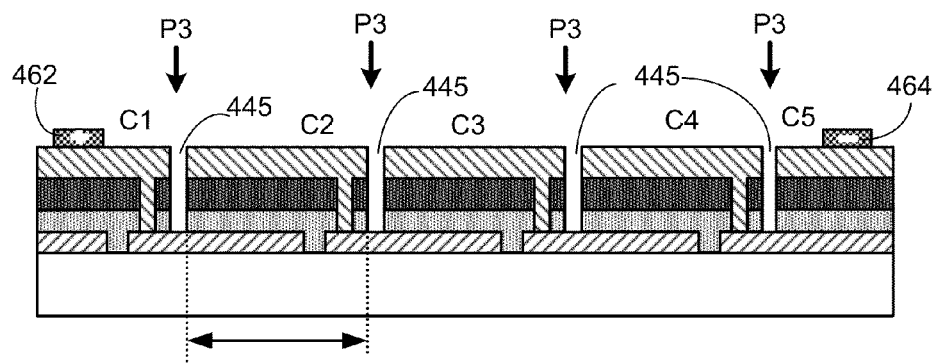

In one aspect of the present invention, a thin film photovoltaic panel utilized as a BIPV panel is fabricated by a series of steps of deposition and laser scribing. FIGS. 4(a)-4(f) illustrate the processing steps of fabricating a thin film photovoltaic panel. First, a front conductive layer 420 is deposited on a substrate 410, as shown in FIG. 4(a). Second, the front conductive layer 420 is scribed by a first laser scribing P1 to create a plurality of first windows or openings 425, thereby dividing the front conductive layer 420 into separate cells, as shown in FIG. 4(b). In this illustrative example, the photovoltaic module comprises five photovoltaic cells C1-C5. Third, an active layer 430 is deposited on the first conductive layer 420, as shown in FIG. 4(c). In this example, the active layer 430 comprises a layer of a-Si 432 formed on the front conductive layer 420 and a layer of μc-Si 434 formed on the a-Si layer 432. Fourth, the active layer 430 is scribed by a second laser scribing P2 to create a plurality of second windows or openings 435, as shown in FIG. 4(d). Fifth, a back conductive layer 440 is deposited on the active layer 430, as shown in FIG. 4(e). Sixth, the back conductive layer 440 is scribed by a third laser scribing P3 to create a plurality of third windows or openings 445, as shown in FIG. 4(f). Last, the positive electrode 462 and the negative electrode 464 are formed on the back conductive layer 440 of the first photovoltaic cell C1 and the back conductive layer 440 of the last photovoltaic cell C5, respectively. The plurality of second openings 435 allow the back conductive layer 440 of each but the last cell to be electrically connected with the front contact layer 420 of an immediate next cell. As fabricated in this fashion, the plurality of cells in the photovoltaic panel is electrically connected to each other in series.

Figure 5:
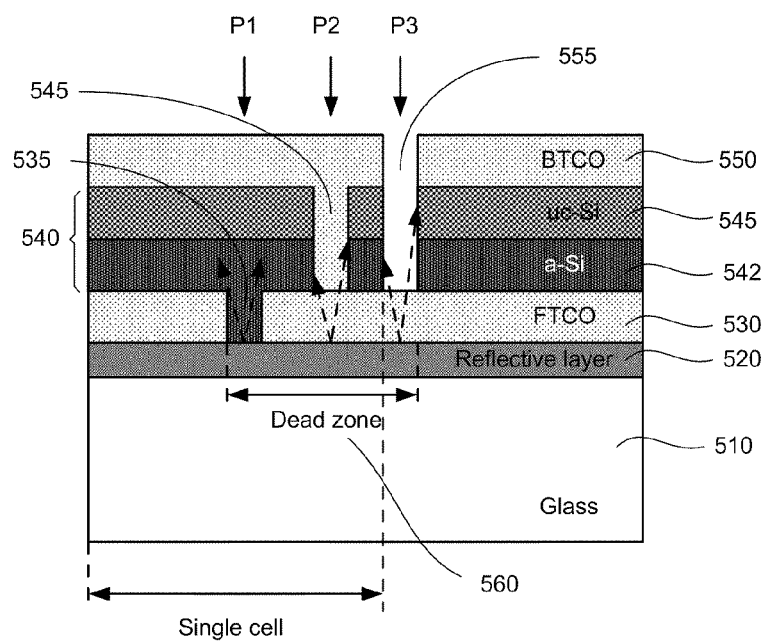
FIG. 5 shows schematically a partially cross sectional view of part a BIPV panel according to one embodiment of the present invention.
Figure 6:
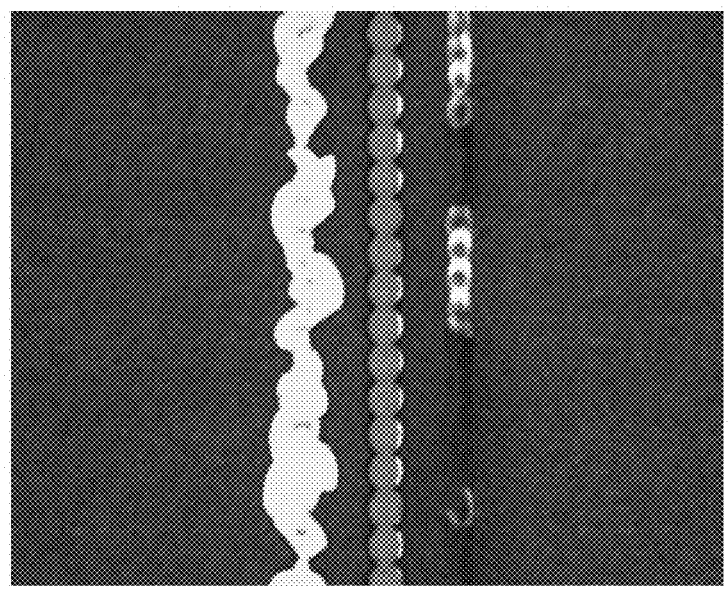
FIG. 6 shows a partial image of a BIPV panel according to one embodiment of the present invention.

FIG. 5 shows schematically a partially cross sectional view of a photovoltaic panel 500 utilized in a BIPV panel according to one embodiment of the present invention. The photovoltaic panel 500 has a plurality of cells, each cell having a reflective layer 520 formed on a substrate 510, a front conductive layer 530 formed on the reflective layer 520, an active layer 540 formed on the front conductive layer 530, and a back conductive layer 550 formed on the active layer 540. In a fabrication process similar to the one described above, the reflective layer 520 is first deposited on the substrate 510. Subsequently, the front conductive layer 530, the active layer 540, and the back conductive layer 550 are sequentially deposited and scribed by laser scribing. The laser scribings P1, P2, and P3 create a plurality of first openings 535, a plurality of second openings 545, and a plurality of third openings 555, respectively. As shown in FIG. 5, because of the presence of the reflective layer 520, parts of the laser beams used in scribing steps P1-P3 are reflected or scattered by the reflective layer 520, as indicated by the dashed arrows in FIG. 5. For full removal of the materials, the wavelength of the laser beams used in each of the laser scribings P1-P3 should be chosen according to the material of the layer being scribed. For ZnO, a material commonly used for the front conductive layer, the wavelength of 355 nm is commonly used for the laser scribing P1. Note that, from FIGS. 2 and 3, light of this wavelength is strongly reflected by the reflective layer. Also, the reflective layer 520 tends to absorb the laser beams used in the laser scribings P2 and P3. The reflection and absorption by the reflective layer 520 cause the scribing lines to be non-uniform or broken at some places, as can be seen in a partial image of a photovoltaic panel shown in FIG. 6.

Figure 7:
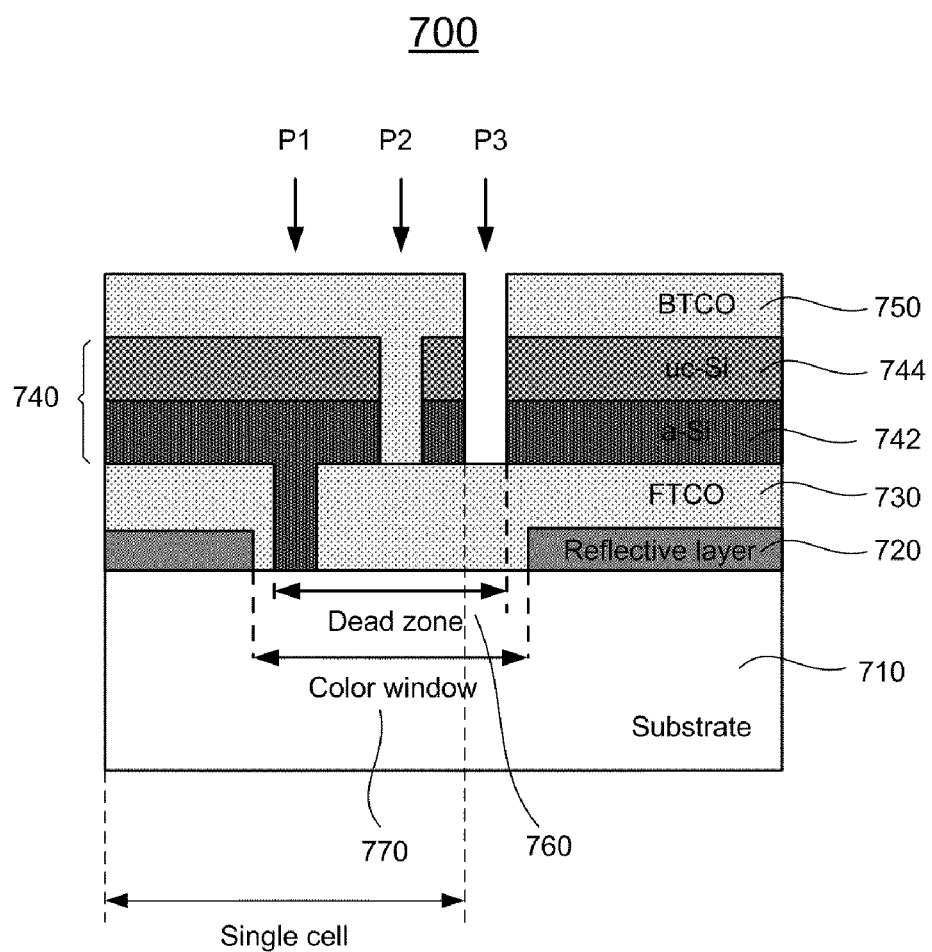
FIG. 7 shows schematically a partially cross sectional view of a BIPV panel according to one embodiment of the present invention.
Figure 8A:
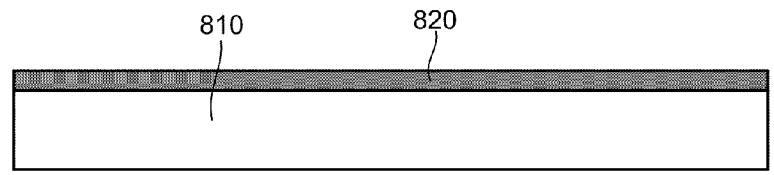
FIGS. 8(a)-8(h) illustrate processing steps of fabricating a BIPV panel according to one embodiment of the present invention.
Figure 8B:
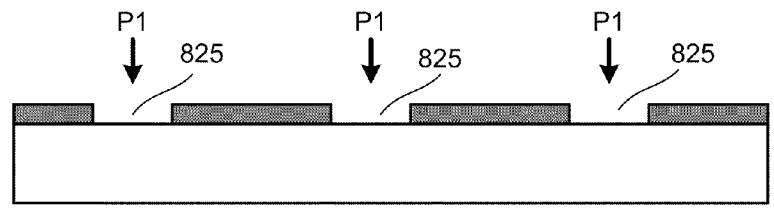
Figure 8C:
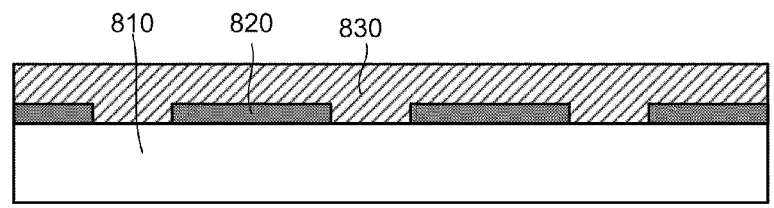
Figure 8D:
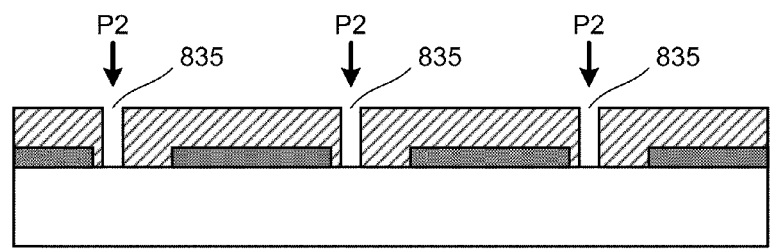
Figure 8E:
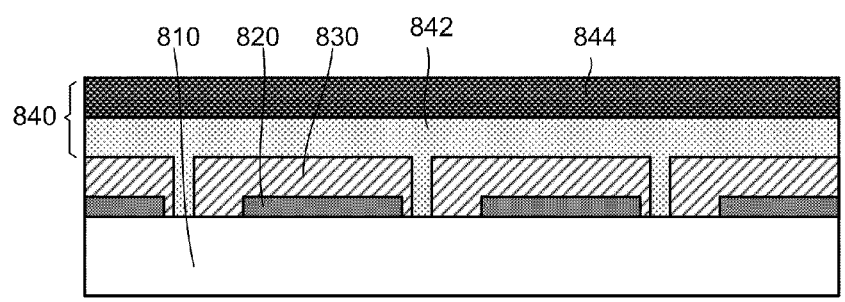
Figure 8F:
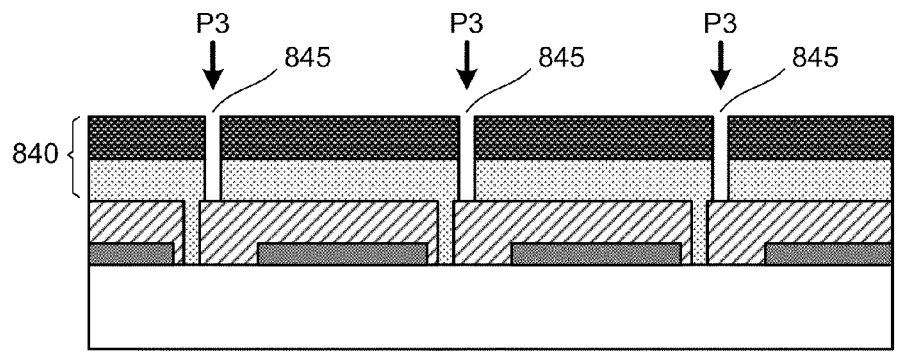
Figure 8G:
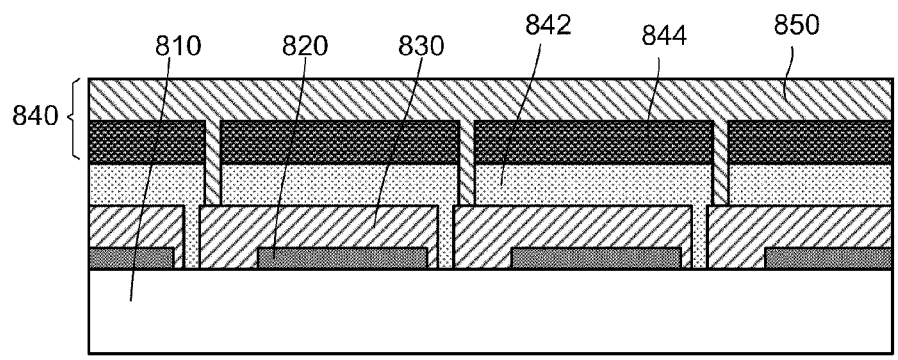
Figure 8H:
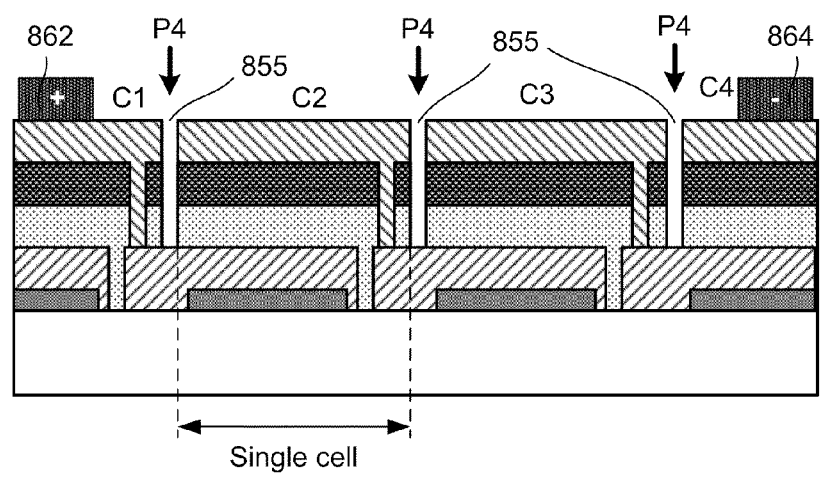

FIG. 7 illustrates a solution to the "dead zone" problem according to one embodiment of the present invention. The photovoltaic panel 700 has a similar structure as that of the photovoltaic panel 500 shown in FIG. 5 with one difference. Here, the reflective layer 720 is pre-patterned to have a plurality of "color windows" 770. Each "color window" 770 is wider than and encompasses a respective "dead zone" 760 so that laser beams used in the scribing steps P1-P3 are not reflected by the reflective layer 720. As a result, the scribing lines will be uniform.

FIG. 8 illustrates a fabrication process of a photovoltaic panel according to one embodiment of the present invention. First, a reflective layer 820 is deposited on a substrate 810 as shown in FIG. 8(a). Second the reflective layer 820 is scribed by a first laser scribing P1 to create a plurality of first windows or openings 825, also referred herein as "color windows," to expose a plurality of first portions of the substrate 810, as shown in FIG. 8(*b*). Third, a front (first) conductive layer 830 is deposited on the reflective layer 820 and on the plurality of first portions of the substrate 810 exposed by the plurality of first windows 825, as shown in FIG. 8(*c*). Fourth, the front conductive layer 830 is scribed by a second laser scribing P2 to create a plurality of second windows or openings 835 to expose a plurality of second portions of the substrate 810, thereby dividing the front conductive layer 830 into separate cells, as shown in FIG. 8(*d*). Each of the plurality of second windows 835 is within a respective first window 825, so that laser beams used in the second laser scribing P2 are not reflected by the reflective layer 820. In this illustrative example, the photovoltaic panel comprises four photovoltaic cells C1-C4. Fifth, an active layer 840 is deposited on the first conductive layer 830, as shown in FIG. 8(*e*). In this example, the active layer 840 comprises a layer of a-Si 842 formed on the front conductive layer 830 and a layer of uc-Si 844 formed on the a-Si layer 842. Sixth, the active layer 840 is scribed by a third laser scribing P3 to create a plurality of third windows or openings 845 to expose a plurality of first portions of the first conductive layer 830, as shown in FIG. 8(*f*). Each of the plurality of third windows 845 is within a respective first window 825 so that laser beams used in the third laser scribing P3 are not reflected by the reflective layer 820. Seventh, a back (second) conductive layer 850 is deposited on the active layer 840, as shown in FIG. 8(*g*). Eighth, the back conductive layer 850 is scribed by a fourth laser scribing P4 to create a plurality of forth windows or openings 855 to expose a plurality of second portions of the first conductive layer 830, thereby separating the cells, as shown in FIG. 8(*h*). Each of the plurality of forth windows 855 is within a respective first window 825 so that laser beams used in the fourth laser scribing P4 are not reflected by the reflective layer 820. Last, a positive electrode 862 and a negative electrode 864 are formed on the back conductive layer 850 of the first photovoltaic cell C1 and the back conductive layer 850 of the last photovoltaic cell C4, respectively. The plurality of third openings 845 allow the back conductive layer 850 of each but the last cell to be electrically connected with the front conductive layer 830 of an immediate next cell. As fabricated in this fashion, the plurality of cells in the photovoltaic panel is electrically connected to each other in series.

Figure 9:
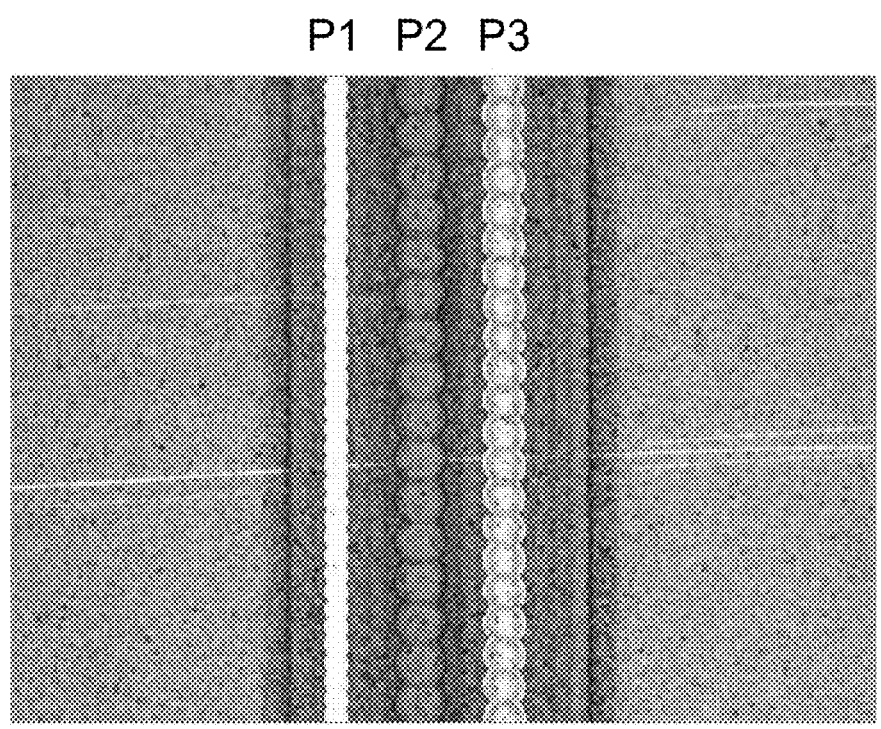
FIG. 9 shows a partial image of a BIPV panel fabricated using the processing steps illustrated in FIG. 8.

FIG. 9 shows a partial image of a photovoltaic panel fabricated by the method described above in conjunction with FIG. 8. As can be seen, the scribing lines formed by laser scribings P2, P3, and P4 are all uniform.

In sum, the present invention, among other things, recites a thin film BIPV panel that reflects a particular color in the visible spectrum.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A building integrated photovoltaic (BIPV) panel, comprising:
    a substrate;
    a reflective layer formed on the substrate, the reflective layer having a plurality of first windows exposing a plurality of first portions of the substrate;
    a first conductive layer formed on the reflective layer and on the plurality of first portions of the substrate exposed by the plurality of first windows, the first conductive layer having a plurality of second windows exposing a plurality of second portions of the substrate, each second window being within a respective first window;
    an active layer formed on the first conductive layer, the active layer having a plurality of third windows exposing a plurality of first portions of the first conductive layer, each third window being within a respective first window; and
    a second conductive layer formed on the active layer, the second conductive layer having a plurality of fourth windows exposing a plurality of second portions of the first conductive layer, each fourth window being within a respective first window,
    wherein the reflective layer has an index of refraction and a thickness such that the reflectance spectrum of the BIPV panel for light incident thereon has a maximum in a selected wavelength range in the visible spectrum, and wherein the reflective layer comprises silicon carbide (SiC) or micro-crystalline silicon (uc-Si).

2. The BIPV panel of claim 1, wherein the selected wavelength range corresponds to a color of purple, dark blue, light blue, silver, gold, orange, red, brown or a combination thereof.

3. The BIPV panel of claim 1, wherein the index of refraction of the reflective layer ranges from about 1.5 to about 6.5.

4. The BIPV panel of claim 1, wherein the thickness of the reflective layer ranges from about 1 nm to about 600 nm.

5. The BIPV panel of claim 1, wherein each of the first conductive layer and the second conductive layer comprises a transparent conducting oxide (TCO) or a metal.

6. The BIPV panel of claim 5, wherein the TCO comprises zinc oxide (ZnO), tin oxide ($SnO_2$), indium tin oxide (ITO), aluminum tin oxide (ATO), aluminum zinc oxide (AZO), cadmium indium oxide (CIO), cadmium zinc, oxide (CZO), gallium zinc, oxide (GZO), fluorine tin oxide (FTO), or a combination thereof.

7. The BIPV panel of claim 5, wherein the metal comprises molybdenum (Mo), titanium (Ti), nickel (Ni), aluminum (Al), gold (Au), silver (As), chromium (Cr), copper (Cu) or a combination thereof.

8. The BIPV panel of claim 1, wherein the active layer comprises one or more photovoltaic layers formed of one or more semiconductors.

9. The BIPV panel of claim 8, wherein the one or more semiconductors comprise group IV element semiconductors, group III-V compound semiconductors, group II-VI compound semiconductors, organic compound semiconductors, or a combination thereof.

10. A building integrated photovoltaic (BIPV) panel, comprising:
    a substrate;
    a first conductive layer;
    an active layer formed on the first conductive layer;
    a second conductive layer formed on the active layer; and
    a reflective layer formed between the substrate and the first conductive layer, or formed on the second conductive layer such that the first conductive layer is formed on the substrate, wherein the reflective layer has an index of refraction and a thickness such that the reflectance spectrum of the BIPV panel for light incident thereon has a maximum in a selected wavelength range in the visible spectrum, wherein the reflective layer comprises (SiC) or micro-crystalline silicon (uc-Si).

11. The BIPV panel of claim 10, wherein the selected wavelength range corresponds to a color of purple, dark blue, light blue, silver, gold, orange, red, brown or a combination thereof.

12. The BIPV panel of claim 10, wherein the thickness of the reflective layer ranges from about 1 nm to about 600 nm.

13. The BIPV panel of claim 10, wherein, each of the first conductive layer and the second conductive layer comprises a transparent conducting oxide (TCO) or a metal.

* * * * *

UNITED STATES PATENT AND TRADEMARK OFFICE
CERTIFICATE OF CORRECTION

PATENT NO. : 8,088,990 B1
APPLICATION NO. : 13/118110
DATED : January 3, 2012
INVENTOR(S) : Chin-Yao Tsai et al.

Page 1 of 1

It is certified that error appears in the above-identified patent and that said Letters Patent is hereby corrected as shown below:

In Column 10, Lines 29-30:

"wherein the reflective layer comprises silicon carbide (SiC) or micro-crystalline silicon (uc-Si)."

should read:

--wherein the reflective layer comprises micro-crystalline silicon (uc-Si).--

In Column 11, Lines 6-7:

"spectrum, wherein the reflective layer comprises (SiC) or micro-crystalline silicon (uc-Si)."

should read:

--spectrum, wherein the reflective layer comprises micro-crystalline silicon (uc-Si).--

Signed and Sealed this
Third Day of April, 2012

David J. Kappos
*Director of the United States Patent and Trademark Office*